(12) United States Patent
Sato et al.

(10) Patent No.: US 6,218,266 B1
(45) Date of Patent: *Apr. 17, 2001

(54) METHOD OF FABRICATING ELECTRONIC DEVICES OF THE TYPE INCLUDING SMOOTHING PROCESS USING POLISHING

(75) Inventors: Junichi Sato, Tokyo; Tetsuo Gocho, Kanagawa, both of (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 07/858,632

(22) Filed: Mar. 27, 1992

(30) Foreign Application Priority Data

Mar. 28, 1991 (JP) .................................... 3-089573

(51) Int. Cl.⁷ .................................. H01L 21/76

(52) U.S. Cl. .................. 438/427; 438/424; 438/631; 438/645

(58) Field of Search .................. 156/643, 645; 437/228, 235; 438/631, 645, 424, 427

(56) References Cited

U.S. PATENT DOCUMENTS

| | | | |
|---|---|---|---|
| 4,601,781 | * 7/1986 | Mercier et al. | 156/643 |
| 4,732,761 | * 3/1988 | Machida et al. | 437/228 |
| 4,735,679 | * 4/1988 | Lasky | 156/636 |
| 4,793,895 | * 12/1988 | Kaanta et al. | 156/636 |
| 4,872,947 | * 10/1989 | Wang et al. | 156/643 |
| 4,910,155 | * 3/1990 | Cote et al. | 156/637 |
| 5,026,666 | * 6/1991 | Hills et al. | 437/228 |
| 5,036,015 | * 7/1991 | Sandhu | 437/8 |
| 5,084,419 | * 1/1992 | Sakao | 437/228 |
| 5,089,442 | * 2/1992 | Olmer | 437/228 |

OTHER PUBLICATIONS

Davari et al. "A variable–stress shallow trench isolation (STI) technology with diffused sidewall doping for submicron CMOS" IEDM, pp. 92–95, Dec. 1988.*

B. Davari et al., "A New Planarization Technique, Using a Combination of RIE and CMP," IEEE–IEDM Jul. 1989, pp 61–64.*

S. Wolf, *Silicon Processing for the VLSI Era*, vol. 2, Lattice Press, Sunset Beach, CA, 1990, pp 237–9, 285–6.*

G. Smith et al., "Sidewall–Tapered Oxide by Plasma–Enhanced CVD," *J. Electrochem. Soc.*, vol. 132, No. 11, pp 2721–5, Nov. 1985.*

K. Machida et al., "SiO$_2$ Planarization Technology with Brasing and ECR Plasma . . . " *J. Vac. Sci. Technol.*, B vol. B–4, No. 4, pp 818–21, Jul./Aug. 1986.*

* cited by examiner

Primary Examiner—Charles Bowers
Assistant Examiner—Erik J Kielin
(74) Attorney, Agent, or Firm—Sonnenschein, Nath & Rosenthal (57) ABSTRACT

In a method of fabricating electronic components of the type wherein trenches formed in a substrate are filled up with a filling material deposited by a deposition process achieving etching and deposition concurrently, the improvement which comprises portions of the filling material deposited on those portion of the substrate other than those corresponding to the trenches are leveled up to the same height by an additional deposition of the filling material, or alternatively by a full-surface etch back process. With this leveling of the deposited material, a subsequent polishing operation can be performed smoothly with high accuracy. During the polishing operation, the resistance between a conductive polish-stop layer on the substrate and a surface of a polishing member contacting the substrate is monitored to determine a polish end.

9 Claims, 14 Drawing Sheets

Fig.2A
PRESENT INVENTION

METHOD OF FABRICATING ELECTRONIC DEVICES OF THE TYPE INCLUDING SMOOTHING PROCESS USING POLISHING

BACKGROUND OF THE INVENTION

1. Field of the Invention

The present invention relates to a method of fabricating electronic devices of the type including a smoothing process using polishing. This invention is applicable to the production of various electronic materials in which A smoothing process is needed. For example, the invention is applicable to a process of fabricating semiconductor devices in which grooves or trenches formed in the surface of a substrate are filled up for planarization, and also to the manufacture of varies electronic devices such as magnetic disks in which smoothing is required.

2. Description of the Prior Art

In the production of electronic devices, smoothing must be achieved in various cases. For example, when grooves or trenches formed in the surface of a substrate are filled up with a filling material, the surface must be smoothed. In addition, the smoothing processes become necessary when a trench isolation, a trench capacitor or a metal wiring portion such as a connector plug is formed, and also when grooves or spaces are filled up to form a necessary part.

To accomplish the smoothing, various techniques using polishing have been considered. The term "polishing" used herein in a comprehensive sense, i.e., to broadly refer to any type of polishing process or system which is capable of accomplishing the smoothing process. Since the polishing is a mechanical means for smoothing an object, it is broadly applicable to various objects without substantial restriction and capable of exhibiting good smoothing accuracy. The polishing is, therefore, attractive and promising. One example of such smoothing processes using polishing is reported in The Nikkei Sangyo published Oct. 2, 1990, in which spherical nylon tools of 10 mm in diameter are used to polish away fine projections on a magnetic disk substrate with smoothing accuracy which is about 2.5 times as high as before.

However, when the polishing is employed to smoothing various electronic devices, we encounter various problems to be solved. A first problem is encountered when the polishing is effected after grooves or trenches in a substrate are filled up by means of a deposition process (such as the bias ECR-CVD, in particular) in which etching and deposition are achieved concurrently. In this instance, however, due to irregularity in height of the portions to be polished, the polishing can only be performed with insufficient accuracy. A second problem is the difficulty in determining a polish end.

The first problem will be discussed below in greater detail. The bias ECR-CVD or the like process which is capable of performing etching and deposition concurrently is an attractive technique. This is because such a deposition technique will promote micro-miniaturization of trench portions in conformity with an advance of the micro-miniaturization and integration of semiconductor devices, and also meet a demand for higher smoothing accuracies. As the miniaturizing and integration densities of semiconductor integrated circuits increase, the conventional selectively oxidized film (LOCOS) method used for isolating circuit elements has been replaced by the shallow trench method. In the shallow trench method, it is extremely effective if grooves or trenches are filled up by the bias ECR-CVD. The bias ECR-CVD accomplishes deposition and etching currently and, hence, is able to fill up wide and narrow trenches (grooves) with a filling material (an insulating material such as $SiO_2$) of a same thickness, thus exhibiting a perfect shallow trenching. In addition, by controlling the ratio of the etching rate to the deposition rate, it is possible to fill up those trenches having a relatively large aspect ratio not less than 1.79, for example. With this control of the ratio of etching rate and deposition rate, lateral leveling can be used. The lateral leveling is a technique to perform deposition under the conditions that the etching proceeds in the lateral direction (parallel to the surface of a substrate), while in the vertical direction, neither etching nor deposition proceeds. Thus, etching is achieved selectively in the lateral direction. With this lateral leveling, it is possible to remove excess materials deposited on portions of the substrate other than those corresponding to trenches, thereby providing a margin or space necessary for a resist film registration or alignment.

The bias ECR-CVD method or the like deposition method described above is, however, still not fully satisfactory because of the drawbacks discussed below.

Since etching and deposition are achieved concurrently, the etching rate necessarily becomes small as a whole. Consequently, the throughput and productivity are relatively low. In addition, if the lateral leveling process is performed to provide a margin for resist registration, the throughput is reduced additional due to a small etching rate in the lateral direction.

With the foregoing drawbacks in view, an attempt has been made to remove an excess filling material ($SiO_2$, for example) by polishing, but various problems have encountered in adopting the polishing process, as described below.

Figure 2A:
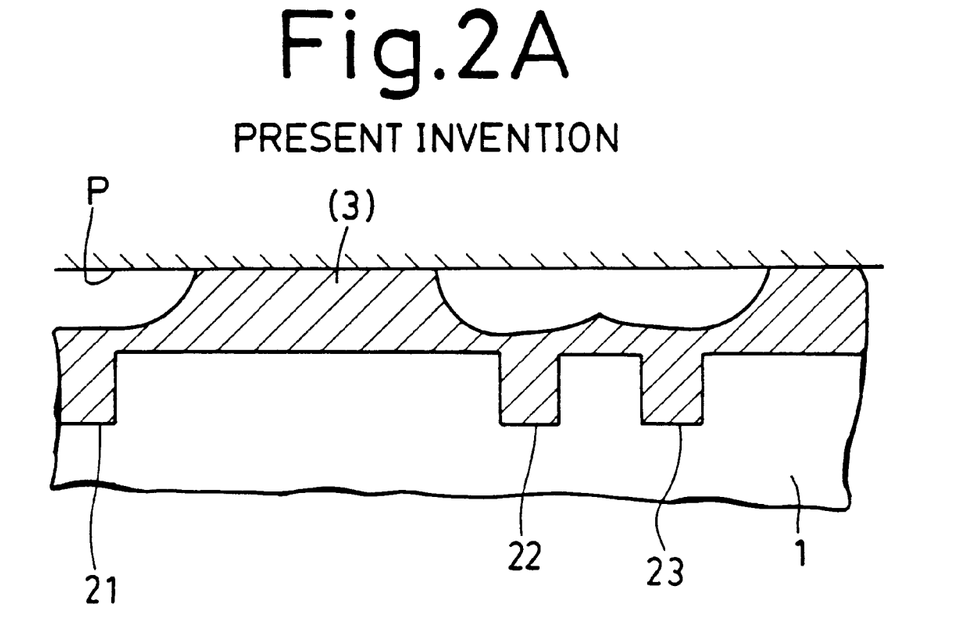
FIGS. 2A and 2B are cross-sectional views showing an advantage of the present invention over the prior art.
Figure 2B:
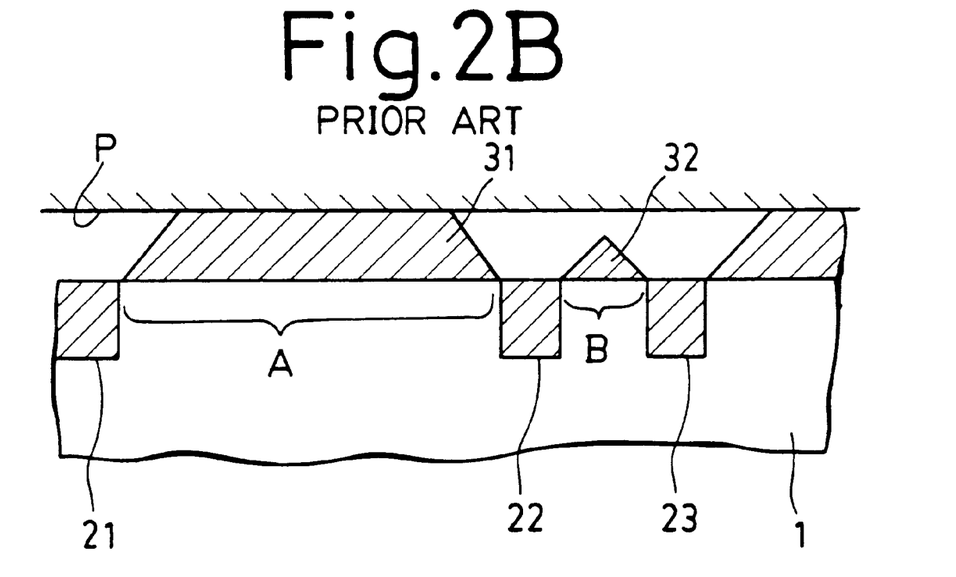

The deposition using the bias ECR-CVD method depends on the substrate. Accordingly, if the conventional bias ECR-CVD method is applied to fill up grooves (trenches) 21–23 in a surface of a substrate 1, as shown in FIG. 2B, a portion 31 of the filling material ($SiO_2$) deposited on a wide land A is different in height from a portion 32 of the filling material deposited on a narrow land B. With this difference in height, these portions 31, 32 are subjected to polishing at different points of time. In addition, if the polishing has an angle dependency, the irregularity in deposition height largely affects the precision of polishing operation. Furthermore, in the bias ECR plasma CVD, in particular, due to a divergent magnetic field used in this process, the thickness of a filling material ($SiO_2$, for example) becomes greater in a central portion of the substrate than in a peripheral portion of the substrate. The thickness irregularity thus produced will deteriorate the quality of the subsequent polishing operation.

A great interest has been shown toward application of the polishing techniques to silicon on insulator (SOI) technology, but any satisfactory solution has not been provided heretofore due to the difficulty in determining a polish end.

SUMMARY OF THE INVENTION

With the foregoing drawbacks of the prior art in view, an object of the present invention is to provide a method of fabricating electronic devices, which is able to eliminate negative influences resulting from irregular deposition of material on a substrate, thereby insuring a high precision polishing of the deposited material.

Another object of this invention is to provide an electronic device fabrication method which is capable of determining a polish end reliably with utmost ease.

In one aspect the present invention provides a method of fabricating an electronic device, of the type wherein grooves formed in a substrate are filled up with a filling material deposited by a deposition process in which etching and deposition are achieved concurrently, wherein the improvement comprises: leveling up the height of portions of the filling material deposited on these portions of the substrate other than those corresponding to the grooves; and thereafter, polishing away said portions of the filling material to smoothen the substrate.

The leveling may be achieved by an additional deposition of the filling material, or alternatively by a full surface etch back process.

In another aspect this invention provides a method of fabricating an electronic device, of the type wherein grooves formed in a substrate are filled up with a filling material deposited by a deposition process in which etching and deposition are achieved concurrently, wherein the improvement comprises: effecting said deposition process under such conditions that the difference in thickness of the deposited filling material between a central portion and a peripheral portion of the substrate is canceled out; and thereafter, polishing the substrate to smooth the same.

In a further aspect the invention provides a method of fabricating an electronic device, of the type wherein grooves formed in a substrate are filled up with a filling material deposited by a deposition process in which etching and deposition are achieved concurrently, wherein the improvement comprises: after said deposition process, effecting an additional deposition process under such conditions that the ratio of deposition rate to etching rate is greater at a peripheral portion than at a central portion of the substrate, thereby reshaping the filling material deposited on the substrate by the first deposition process; and thereafter, polishing the substrate to smooth the same.

In still another aspect the invention provides a method of fabricating an electronic device, of the type including a smoothing process achieved by polishing with a polishing member, wherein improvement comprises: forming a conductive polish-stop layer over a substrate; effecting said smoothing process; and during said smoothing process, monitoring the electric resistance between the substrate and a surface of the polishing member contacting the substrate, thereby determining a polish end according to changes in electric resistance.

The above and other objects, features and advantages of the present invention will become more apparent from the following description taken in conjunction with the accompanying drawings.

DETAILED DESCRIPTION OF THE INVENTION

The invention will be described in greater detail with reference to certain preferred embodiments shown in the accompanying drawings.

FIGS. 1A through 1D show a first embodiment of the present invention which is applied in a shallow trench isolation used for isolating component elements of a semiconductor integrated circuit.

Figure 1A:
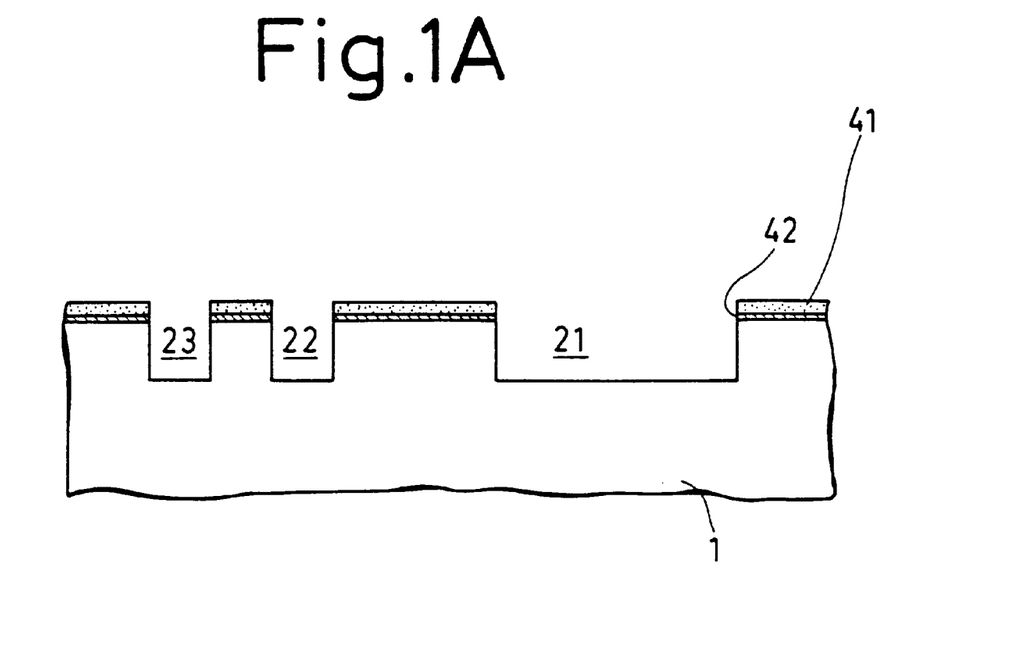
FIGS. 1A through 1D are cross-sectional views showing sequential steps of fabricating an electronic device according to a first embodiment of this invention.
Figure 1B:
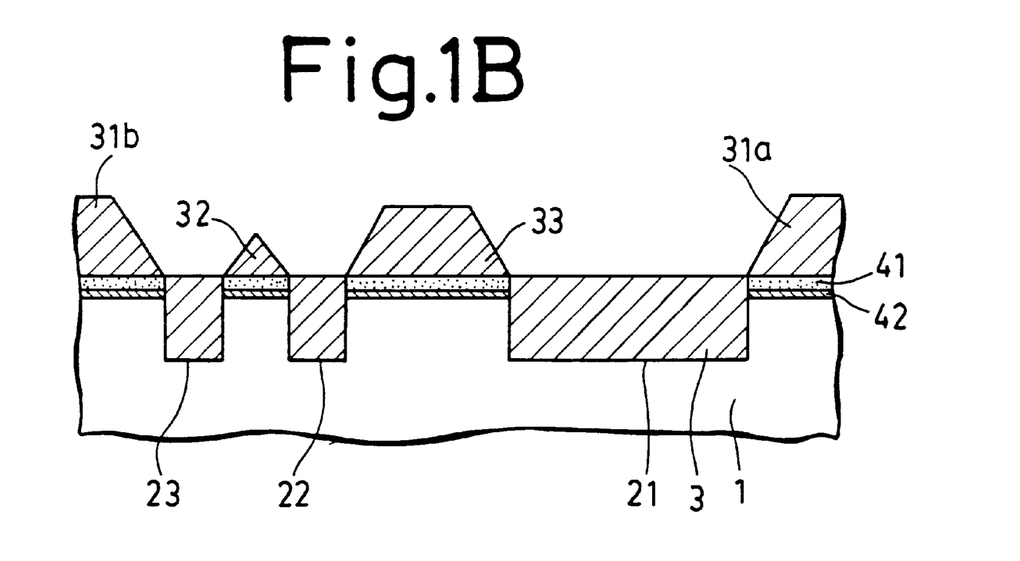
Figure 1C:
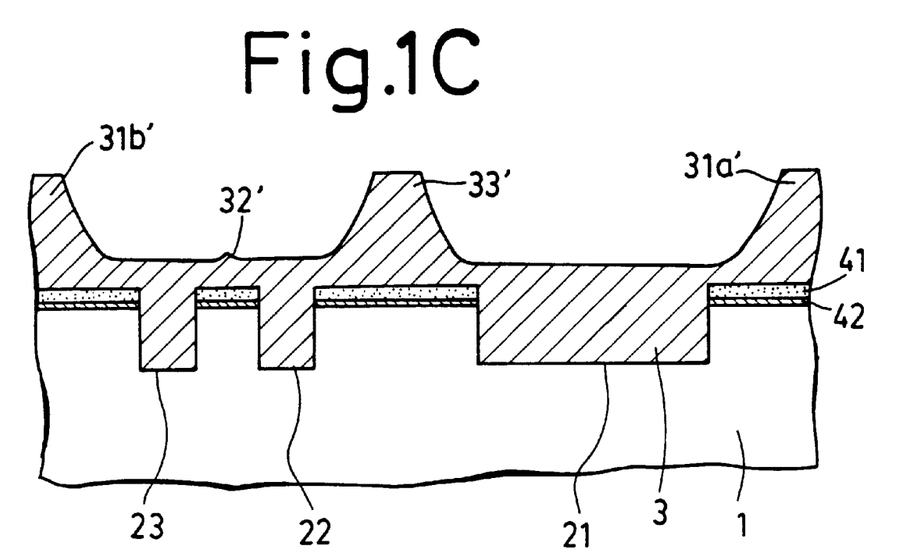

In this embodiment, a silicon semiconductor substrate 1 shown in FIG. 1A is used. The substrate 1 has grooves or trenches 21–23 formed in its surface. The trenches 21–23 are filled up with a filling material 3 by a deposition process in which etching and deposition are achieved concurrently. In this instance, portions 31a, 31b, 32, 33 (FIG. 1B) of the filling material 3 which are deposited on portions of the surface of the substrate 1 other than those corresponding to the trenches 21–23 are leveled up until they have substantially a same height, as shown in FIG. 1C, generally indicated by reference characters 31a', 31b', 32', 33', respectively. Subsequently, a smoothing process depending on the polishing operation is effected to obtain a planar structure shown in FIG. 1D.

The leveling process in this embodiment is achieved by an additional deposition of filling material 3 ($SiO_2$, in this embodiment). As described later in greater detail, the filling material $SiO_2$ 3 is deposited additionally during which time a lowest deposited portion 32 is etched into a substantially flat shape by the lateral leveling etching. Thus, the structure shown in FIG. 1C is obtained.

Stated more specifically, a laminated structure composed of a polish-stop layer 41 of Silicon Nitride ($Si_3N_4$) and an etch-stop layer 42 of $SiO_2$ for stopping etching action on the $Si_3N_4$ polish-stop layer 41 is formed over the surface of a silicon substrate 1. Then, a trench pattern for isolating elements is prepared by photolithography and silicon trench etching, so that shallow grooves or trenches 21–23 are formed in the silicon substrate 1, as shown in FIG. 1A. The thickness of the $Si_3N_4$ polish-stop layer 41 is 500 Å, for example, and the thickness of the $SiO_2$ etch-stop layer 42 is 100 Å, for example. The aspect ratio of the narrow trenches 22, 23 is greater than 1.79. The invention is suitably applicable to the trenches of this nature.

Then, the trenches 21–23 are filled up by the bias ECR-CVD. In practice, inside walls of the trenches 21–23 are oxidized prior to the bias ECR-CVD process. Conditions for the bias ECR-CVD are as follows.

Etching gas: $SiH_4/N_2O$=20/35 SCCM
Gas pressure: $7 \times 10^{-4}$ Torr (0.093 Pa)
Microwave: 1000 W
RF bias: 500 W With this bias ECR-CVD process, the trenches 21–23 are filled up with a filling material 3, as shown in FIG. 1B. A portion 32 of the filling material deposited on a narrow land extending between the narrow trenches 22 and 23 is smaller in height than portions 31a, 31b, 32, 33 of the filling material 3 deposited on wide lands. The height of the portion 22 of the filling material which is deposited on the wide land extending between the narrow trench 22 and the wide trench 21 is the substantially the same as, or slightly smaller than, the height of the adjacent portions 31a, 31b of the deposited filling material.

According to the conventional technology, a smoothing process is then started, with the trenches 21–23 filled up with the filling material 3 such as shown in FIG. 1B. However, in the embodiment of this invention, the bias ECR-CVD still continues so that an additional deposit of filling material ($SiO_2$) 3 is formed. With this additional depositing, a lowest one 33 of the deposited $SiO_2$ portions 31a, 31b, 33 to be removed is leveled up until it has the same height as the other $SiO_2$ portions 31a, 31b, on the wide lands. A structure thus obtained is shown in FIG. 1C. As is apparent from FIG. 1C, all the deposited $SiO_2$ portions 31a', 31b', and 33' have the same height.

Figure 1D:
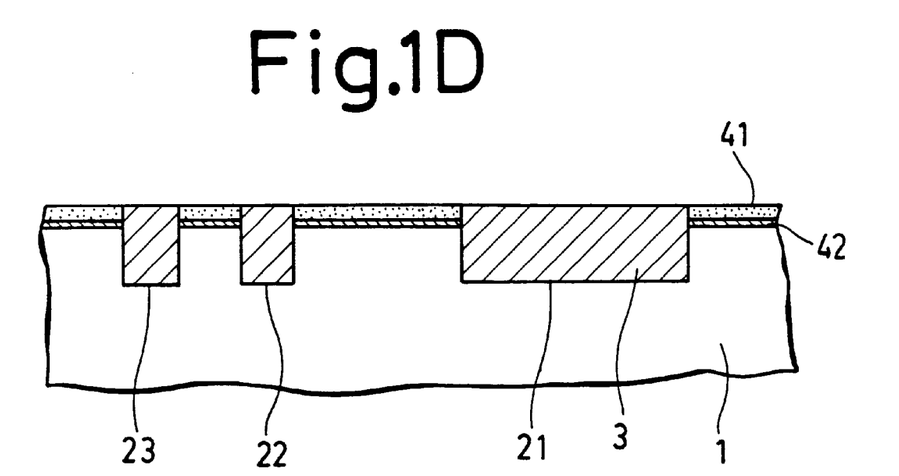

Thereafter, an excessive $SiO_2$ is removed by polishing, whereby a smoothed structure such as shown in FIG. 1D is obtained. The polishing process used here may be of the conventional type or of the type using the nylon balls described above. For the polishing process, the structure preferably has patterns of the same width which are formed by using a stencil structure as described in Japanese Patent Application No. 3-24041 filed by to the present assignee.

Subsequently, the $Si_3N_4$ polish-stop layer 41 is etched off as required. In this instance, due to the presence of the $SiO_2$ etch-stop layer 42, the base silicon substrate 1 is not affected at all by the etching process. With this etching, the $SiO_2$ slightly projects from the trenches 21–23, so that the dielectric breakdown strength of the structure is improved.

As described above, the trenches 21–23 are filled up by the bias ECR-CVD which accomplishes etching and deposition concurrently, and then an excessive filling material ($SiO_2$) deposited on portions of the substrate 1 other than those corresponding to the trenches 21–23 is smoothed by polishing. According to the first embodiment of this invention, before the polishing is effected, the excessive $SiO_2$ is leveled up to the same height. Accordingly, as against the prior art such as shown in FIG. 2B, the deposited $SiO_2$ portions in the first embodiment are uniform in height, as shown in FIG. 2A. With this uniform height, the polishing accuracy is not affected by the pattern of deposited material, and the throughput can, therefore, be improved.

A second embodiment of this invention will be described below with reference to FIGS. 3A through 3D.

Figure 3A:
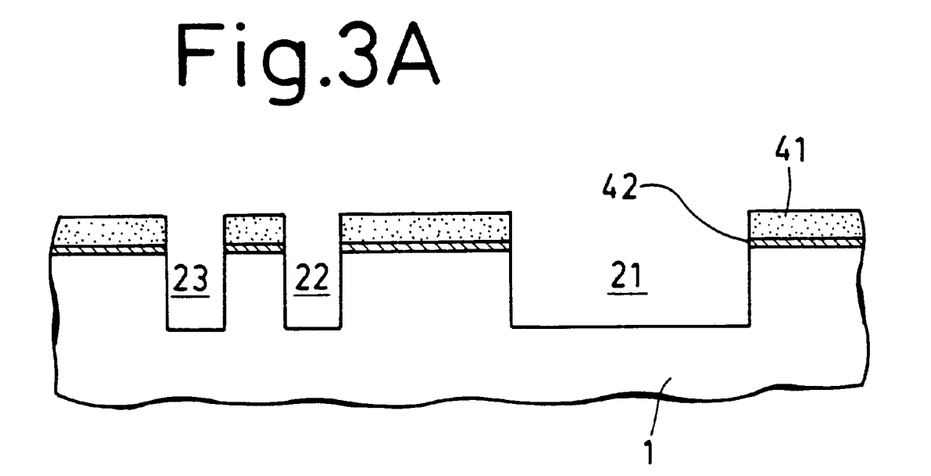
FIGS. 3A through 3D are cross-sectional views showing sequential steps of fabricating an electronic device according to a second embodiment of this invention.

Likewise the first embodiment described above, a laminated structure composed of a polish-stop layer 41 of $Si_3N_4$ and an etch-stop layer 42 of $SiO_2$ is formed over the surface of a silicon substrate 1. Then, a trench pattern for isolating elements is formed in the silicon substrate 1 by photolithography and silicon trench etching, thus forming shallow grooves or trenches 21–23 in the silicon substrate 1, as shown in FIG. 3A. The thickness of the $Si_3N_4$ polish-stop layer 41 is 1000 Å (100 nm), for example. The $SiO_2$ etch-stop layer 42 has the same thickness as that in first embodiment described above.

Then, the trenches 21–23 are filled up by the bias ECR-CVD. The bias ECR-CVD process is performed under the following conditions.

Figure 3B:
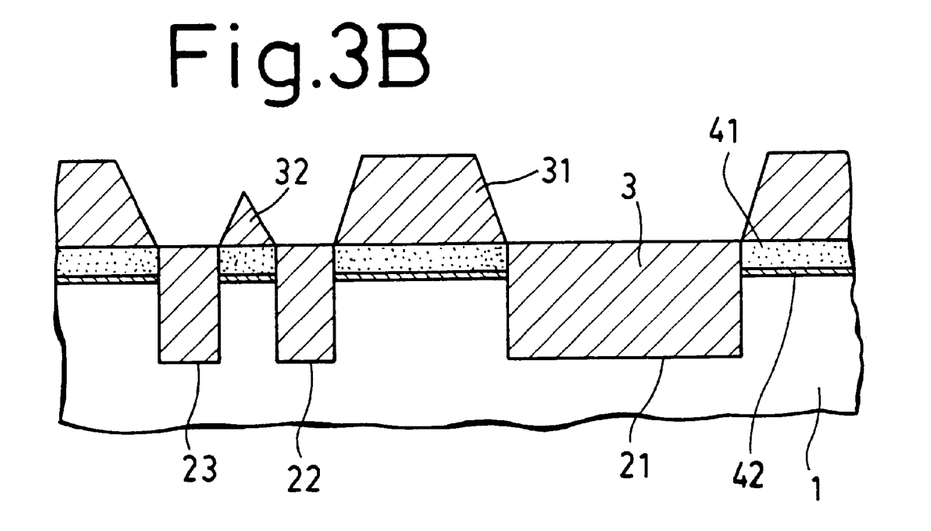

Gas: $SiH_4/N_2O$=7.5/35 SCCM
Gas pressure: $7 \times 10^{-4}$ Torr (0.093 Pa)
Microwave: 1000 W
RF bias: 500 W With this bias ECR-CVD process, the trenches 21–23 are filled up with a filling material 3, as shown in FIG. 3B.

Subsequently, a full-surface etch back process is performed such that a deposited $SiO_2$ portion 32 which is smaller in height than a wider deposited $SiO_2$ portion 31 is completely removed. Conditions for the etch back process are as follows.

Figure 3C:
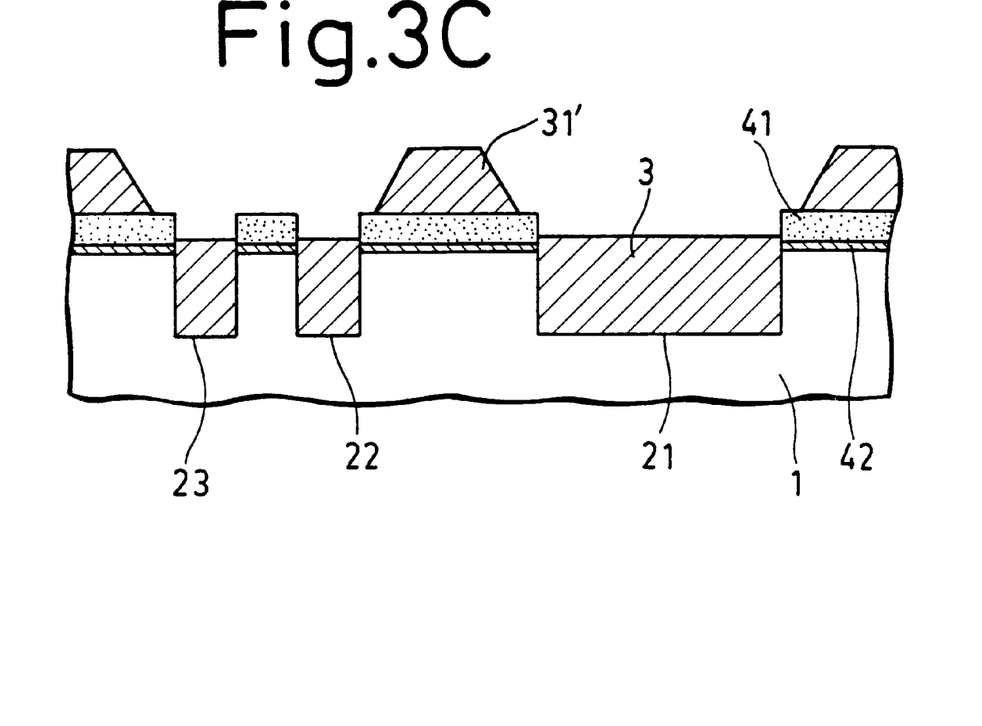

Etching gas: $CHF_3/O_2$=75/8 SCCM
Gas pressure: 0.05 Torr (6.65 Pa)
Applied electric power: 0.23 W/cm$^2$ With this etch back process, a structure shown in FIG. 3C is obtained. An $SiO_2$ portion on the wide land formed after the etch back process is designated by 31'. It is preferable that the thickness of the $Si_3N_4$ polish-stop layer 41 is variable with the amount of etch back.

Figure 3D:
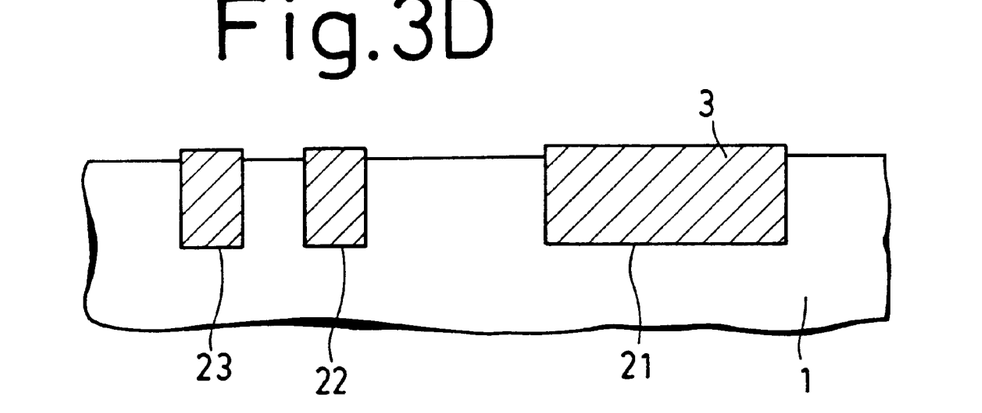

Thereafter, polishing is effected on the deposited $SiO_2$ portions 31' to remove an excessive $SiO_2$, whereby a polished smooth structure such as shown in FIG. 3D is obtained. The polishing method used here is the same as the first embodiment. In this second embodiment, however, the $Si_3N_4$ polish-stop layer 41 is removed to such an extent that the polished $Si_3N_4$ polish-stop layer 41 lies flush with the outer surface of $SiO_2$ portions deposited in the trenches 21–23. Then, the $Si_3N_4$ polish-stop layer 41 is fully removed by etching with $H_3PO_3$. As a result, the $SiO_2$ portions in the trenches 21–23 projects from the surface of the silicon substrate 1. The second embodiment described above has the same advantage as the first embodiment.

A third embodiment described below is characterized by canceling out the difference in film thickness produced between a central portion and a peripheral portion of the substrate when the bias ECR-CVD is performed to fill up trenches in a substrate. More particularly, the canceling is accomplished by establishing lateral leveling conditions that the deposition rate is smaller in the central portion than the peripheral portion of the substrate.

In the third embodiment, trenches 21, 22 in a silicon substrate or wafer 1 are filled up with a filling material 3 by using the bias ECR plasma CVD. The bias ECR plasma CVD is effected such that the filling material 3 deposited on a peripheral portion of the silicon wafer 1 lies flush with outer edges of the trenches 21, 22, as shown in FIG. 4B. Conditions for such bias ECR plasma CVD are as follows.

Etching gas: $SiH_4$=21 SCCM, $N_2O$=35 SCCM
Microwave: 1000 W
RF bias: 500 W
Gas pressure: $\sim 7 \times 10^{-4}$ Torr (0.093 Pa)
Magnetic field: 875 gauss (0.0875 T)

Figure 4A:
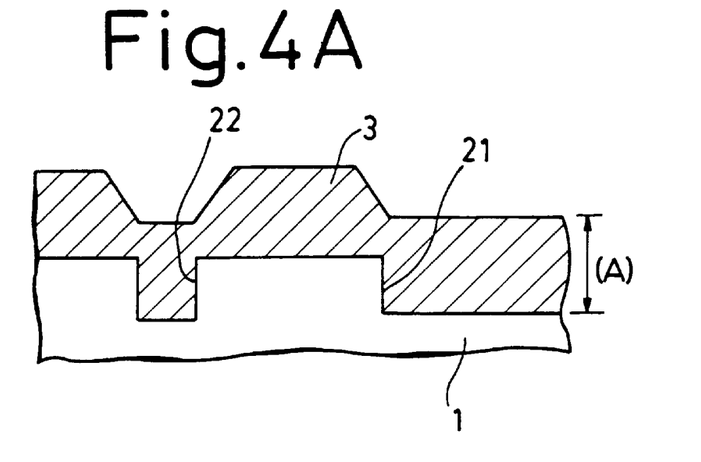
FIGS. 4A and 4B are cross-sectional views showing a central portion and a peripheral portion, respectively, of a wafer processed in accordance with a third embodiment of this invention.
Figure 4B:
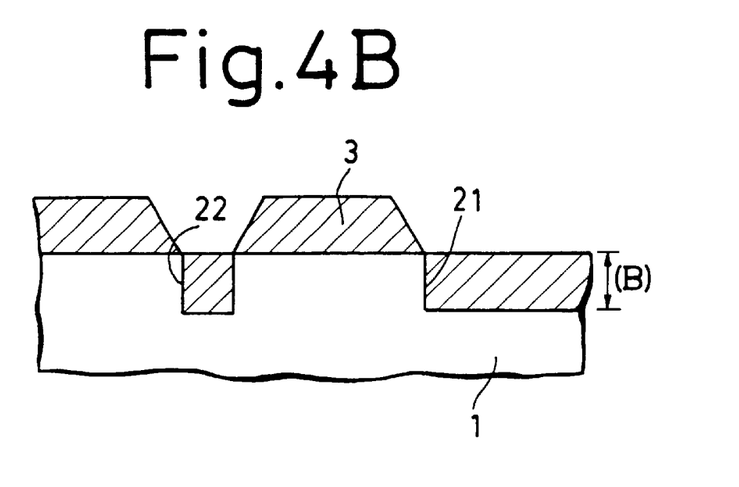
Figure 5:
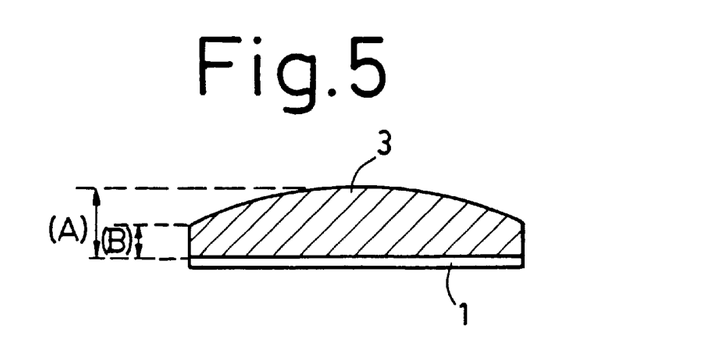
FIG. 5 is a cross-sectional view in the direction perpendicular to the sectional plane of FIGS. 4A and 4B.

A filled-up structure established at the central portion of the silicon wafer 1 is shown in FIG. 4A. As also shown in FIG. 5, the film thickness (A) formed at the central portion of the silicon wafer 1 is larger than the film thickness (B) at the peripheral portion.

Figure 6:
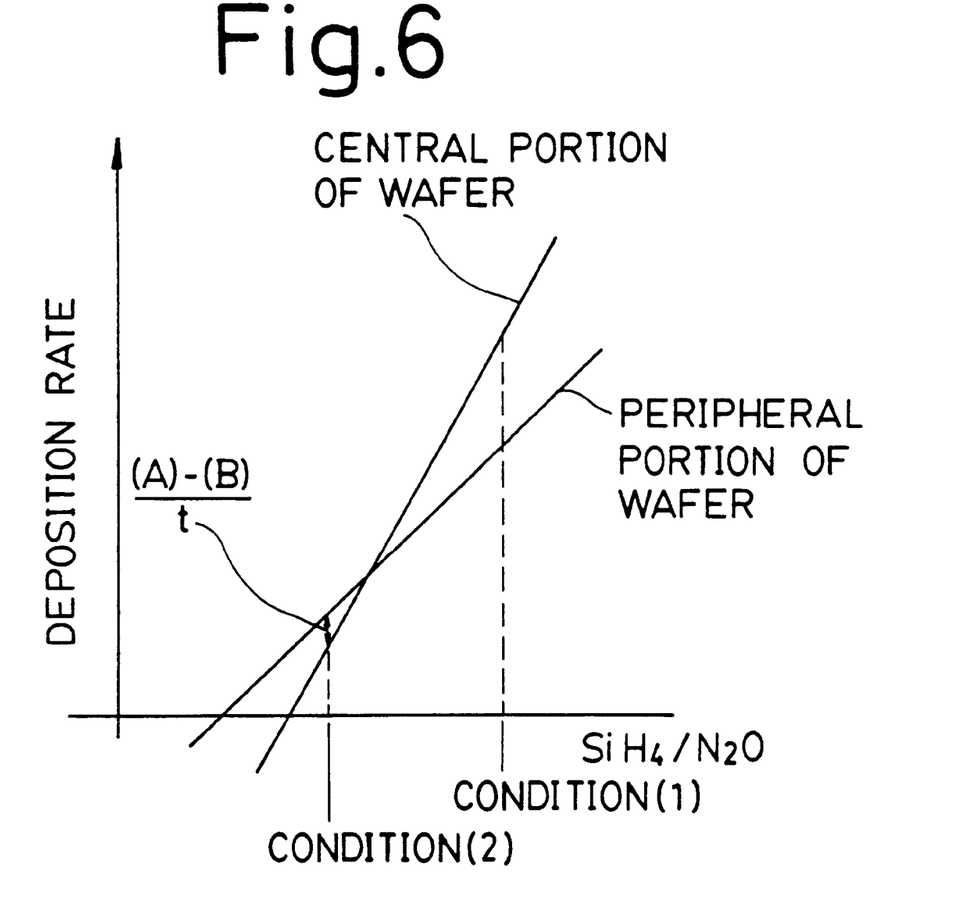
FIG. 6 is a graph showing the principle of operation of the third embodiment in conjunction with the relation between the deposition rate and the $SiH_4/N_2O$ ratio.

The bias ECR plasma CVD process (first step) described above is followed by a lateral leveling etching process (second step). The lateral leveling etching is effected under the conditions that the difference (A)–(B) in film thickness generated during the first step is canceled out. In the bias ECR-CVD process, the above-mentioned relation in deposition rate between the central portion and the peripheral portion of the wafer 1, that is, (A)>(B) is reversed as the $SiH_4/N_2O$ ratio decreases (see, FIG. 6). Using this phenomenon, conditions for the lateral leveling etching are determined. More specifically, the lateral leveling etching is effected under the conditions that the difference in film thickness divided by the necessary time (A–B)/t is equal to the difference in deposition rate between the central portion and peripheral portion of the wafer. For example, if the difference in film thickness (A)–(B) produced in the first step is 1000 Å (100 nm), then the lateral leveling etching is performed for 50 min under the following conditions.

Etching gas: $SiH_4$=6.2 SCCM, $N_2O$=35 SCCM
Microwave: 1000 W
RF bias: 500 W
Gas pressure: ~$7\times10^{-4}$ Torr (0.093 Pa)
Magnetic field: 875 gauss (0.0875 T)

With this lateral leveling etching, the difference in film thickness between the central portion and the peripheral portion of the wafer 1 can be canceled out.

The lateral leveling etching is followed by an etch back process effected on the $SiO_2$ deposited portions. Then, a photo resist patterning, an $SiO_2$ removing process, and a photo resist removing process are effected in succession so that a planar trench isolation structure is obtained.

Figure 7A:
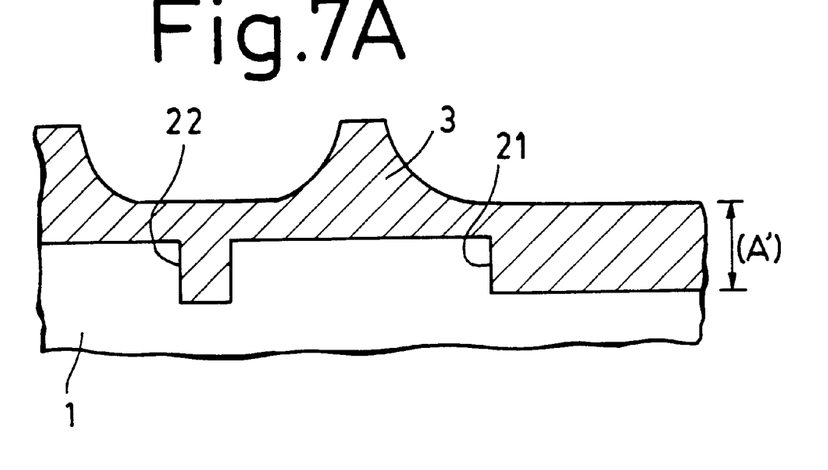
FIGS. 7A and 7B are cross-sectional views similar to FIGS. 4A and 4B, but showing the condition after lateral leveling process is performed.
Figure 7B:
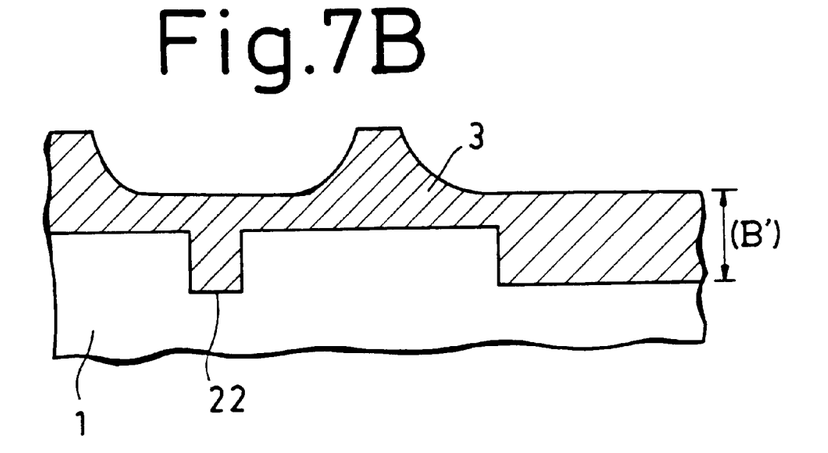
Figure 8:
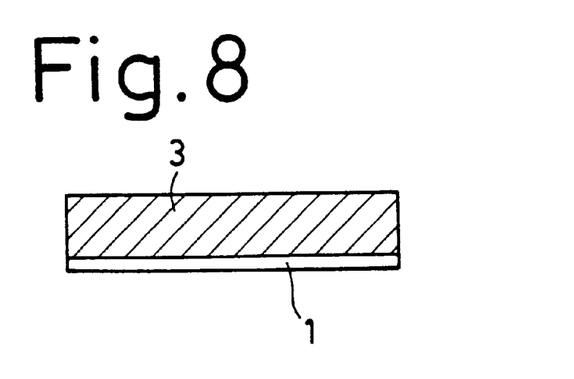
FIG. 8 is a cross-sectional view showing the thickness uniformity of the wafer obtained after the lateral leveling process.

FIG. 7A shows the structure of a central portion of the wafer obtained after the lateral leveling etching. FIG. 7A is a view similar to FIG. 7B, but showing a peripheral portion of the wafer. And, FIG. 8 shows the thickness uniformity of the $SiO_2$ layer formed over the wafer.

Then the wafer is subjected to a polishing process. Since the difference in thickness between the central portion and the peripheral portion of the wafer 1 has already been canceled, polishing can be performed smoothly with high accuracies.

FIGS. 9A through 12B show a fourth embodiment of this invention which has the same advantage as the third embodiment described above. The fourth embodiment differs from the third embodiment in that a film formed to fill up trenches is reshaped by performing a deposition process under a specific condition that the ratio of the etching rate to the deposition rate becomes greater at the peripheral portion than at the central portion of the substrate or wafer.

Figure 9A:
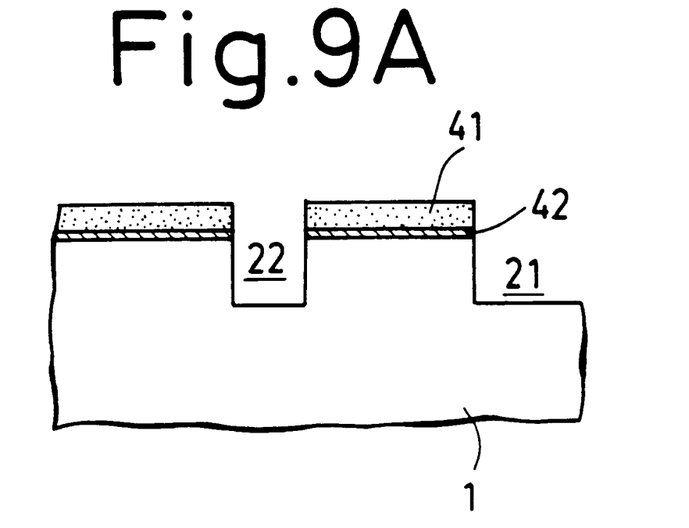
FIGS. 9A and 9B are cross-sectional views showing a central portion and a peripheral portion, respectively, of an electronic device as they are subjected to a first processing step of a semiconductor fabrication method according to a fourth embodiment of this invention.
Figure 9B:
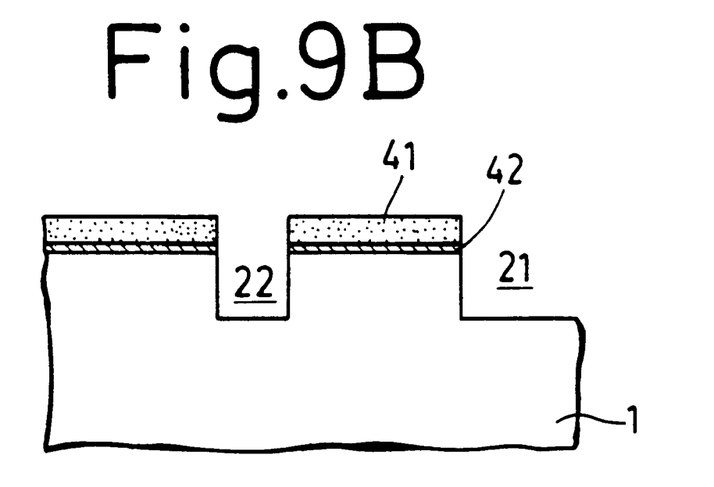

In this embodiment, to a substrate with a double-layered or two-ply lamination of an $SiO_2$ (10 nm) and an $Si_3N_4$ (150 nm), a desired trench pattern is formed by the conventional lithography and dry etching techniques. As a result of this trench pattern formation process, a structure such as shown in FIGS. 9A and 9B is obtained. The structure includes an $Si_3N_4$ polish-stop layer 41, an $SiO_2$ etch-stop layer 42, and trenches 21, 22 formed in a substrate 1. FIG. 9A illustrates a peripheral portion of the structure, while FIG. 9B shows a central portion of the structure. The inside walls of the trenches 21, 22 are oxidized (oxide film being not shown).

Figure 10A:
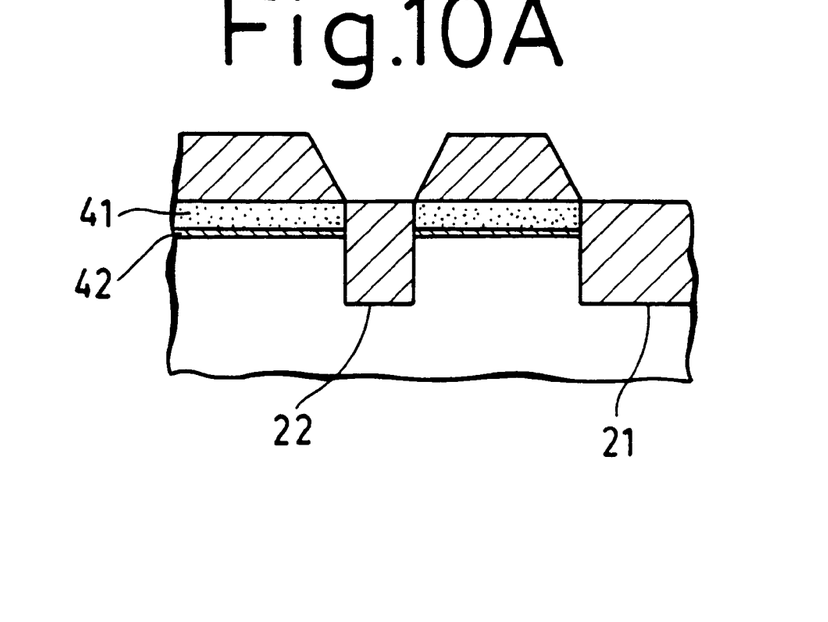
FIGS. 10A and 10B, 11A and 11B, and 12A and 12B are cross-sectional views similar to FIGS. 9A and 9B, but showing second, third and fourth succeeding processing steps of the fourth embodiment.
Figure 10B:
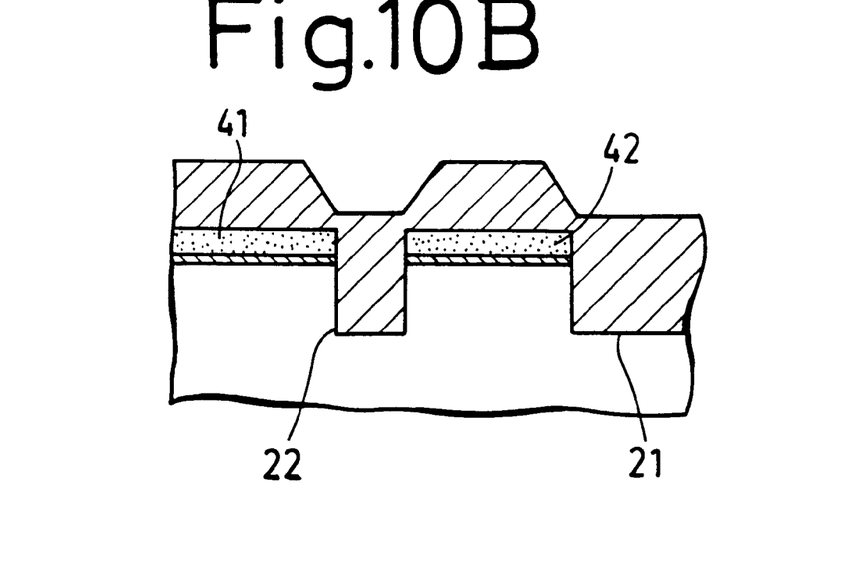

Then, the trenches 21 and 22 are filled up with a filling material ($SiO_2$) deposited by the bias ECR-CVD. As shown in FIGS. 10A and 10B, the deposited $SiO_2$ film layer is thicker in the central portion (FIG. 10B) than in the peripheral portion (FIG. 10A) of the substrate. Conditions for the bias ECR-CVD process are as follows.

Etching gas: $SiH_4/N_2O$=20/35 SCCM
Gas pressure: $7\times10^{-4}$ Torr (0.093 Pa)
RF bias: 500 W
Microwave: 1000 W
Magnetic field: 875 gauss (0.0875 T)

In this instance, the deposited $SiO_2$ film layer is made somewhat thicker so as to compensate for losses which will be caused in the subsequent etching process.

Figure 11A:
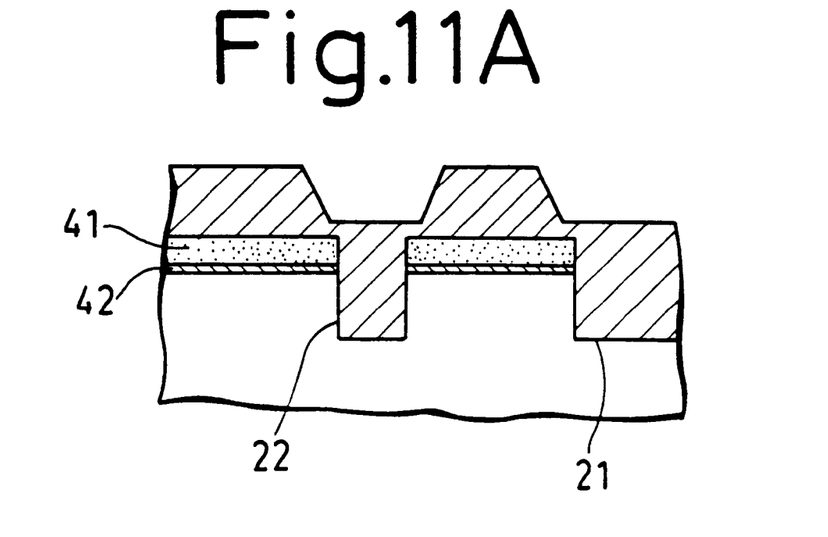
Figure 11B:
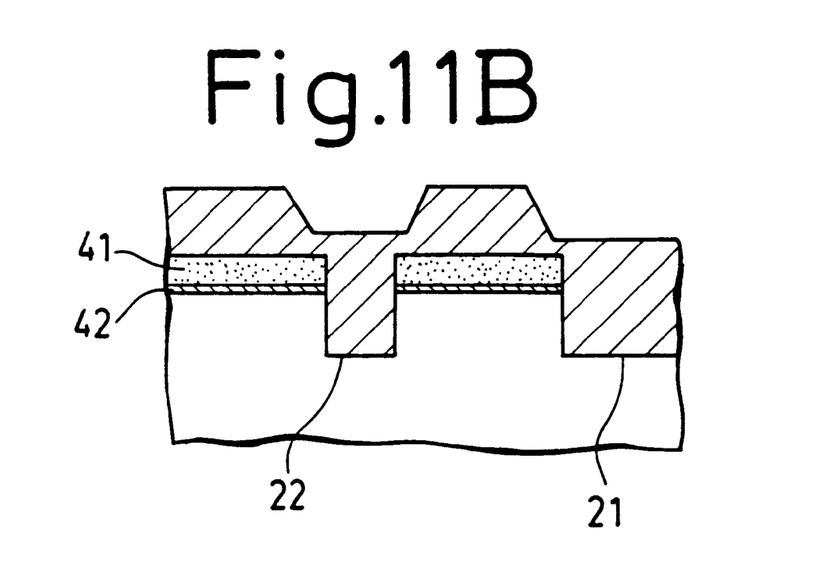

Thereafter, an $SiO_2$ film is deposited under the conditions that the ratio of the deposition rate to the etching rate is greater at the peripheral portion than at the central portion of the substrate. As a result of this uneven deposition, the $SiO_2$ film layer is reshaped, as shown in FIG. 11A (peripheral portion) and FIG. 11B (central portion). For this reshaping, the lateral leveling etching may be used. Detailed conditions for the second $SiO_2$ deposition are as follows.

Gas: $SiH_4/N_2O$=9–12/35 SCCM
Gas pressure: $7\times10^{-4}$ Torr (0.093 Pa)
RF bias: 500 W
Microwave: 1000 W
Magnetic field: 875 gauss (0.0875 T)

The flow rate of etching gas is increased as compared to the conventional method. The greater the gas flow rate, the greater the deposition at the peripheral portion of the substrate.

Figure 12A:
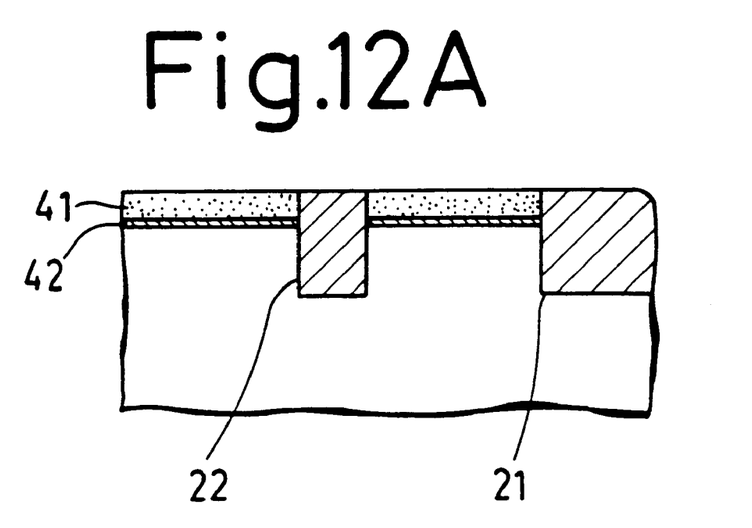
Figure 12B:
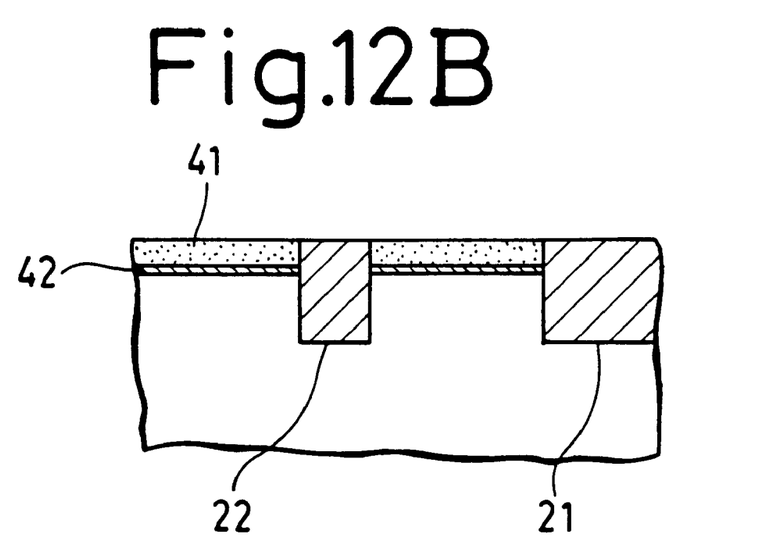

Then, a conventional polishing process is effected to smoothen the substrate such as shown in FIGS. 12A and 12B.

FIGS. 13 through 16 show a fifth embodiment of this invention. According to the fifth embodiment, a polish end can be determined easily and reliably through a measurement of electric resistance.

Figure 13:
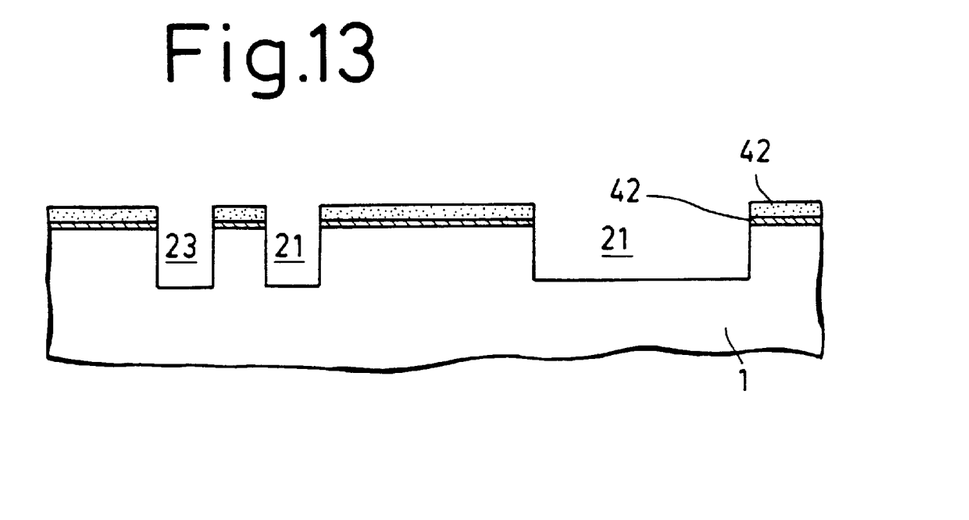
FIG. 13 is a cross-sectional view showing a first step in a fifth embodiment of this invention.

As shown in FIG. 13, a buffer $SiO_2$ (10 nm) film 42 and an $Si_3N_4$ (150 nm) film 41 are formed in succession over the surface of a silicon substrate 1 by using a conventional process, and after that grooves or trenches 21–23 are formed in the silicon substrate 1 by lithography and dry etching. The $Si_3N_4$ film 41 is used as a polish-stop layer, while the buffer $SiO_2$ film 42 is etch-stop layer for stopping etching action on the $Si_3N_4$ polish-stop layer 41.

Then, the trenches 21–23 are filled up with a filling material 3 by the bias ECR-CVD. Conditions for the bias ECR-CVD process are as follows.

Etching gas: $SiH_4/N_2O$=20/35 SCCM
Gas pressure: $7\times10^{-4}$ Torr (0.093 Pa)
Microwave: 1000 W
RF bias: 500 W
Magnetic field: 875 gauss (0.0875 T)

Figure 14:
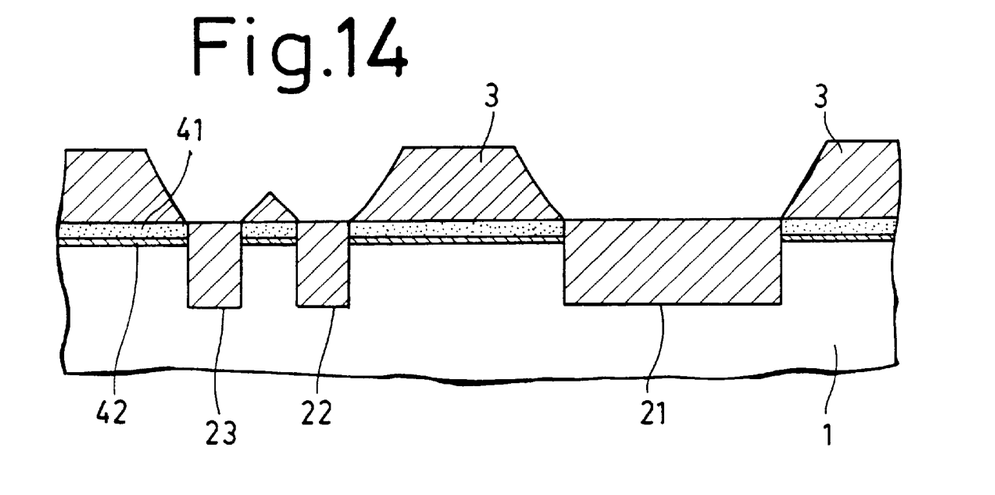
FIG. 14 is a cross-sectional view similar to FIG. 13, but showing a second step of the fifth embodiment.

The structure obtained after the bias ECR-CVD process is shown in FIG. 14.

Thereafter, a polishing process is performed using a polish head P which is electrically conductive and of the conventional configuration. In this polishing process, the electrical resistance between the back of the substrate (wafer) 1 and the conductive polish head P is continuously measured for a purpose described below. The back of the substrate 1 is coated with an $Si_3N_4$ film 41 formed by the low pressure CVD (LP-CVD).

Figure 15:
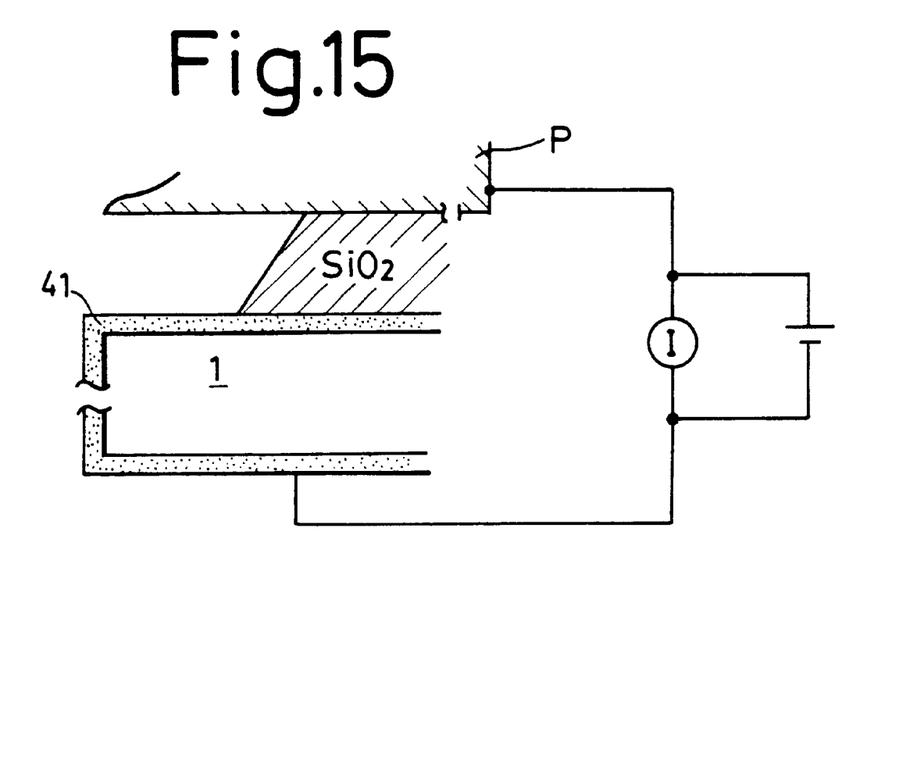
FIG. 15 is a fragmentary cross-sectional view, with parts shown in circuit diagram, of a third step of the fifth embodiment.
Figure 16:
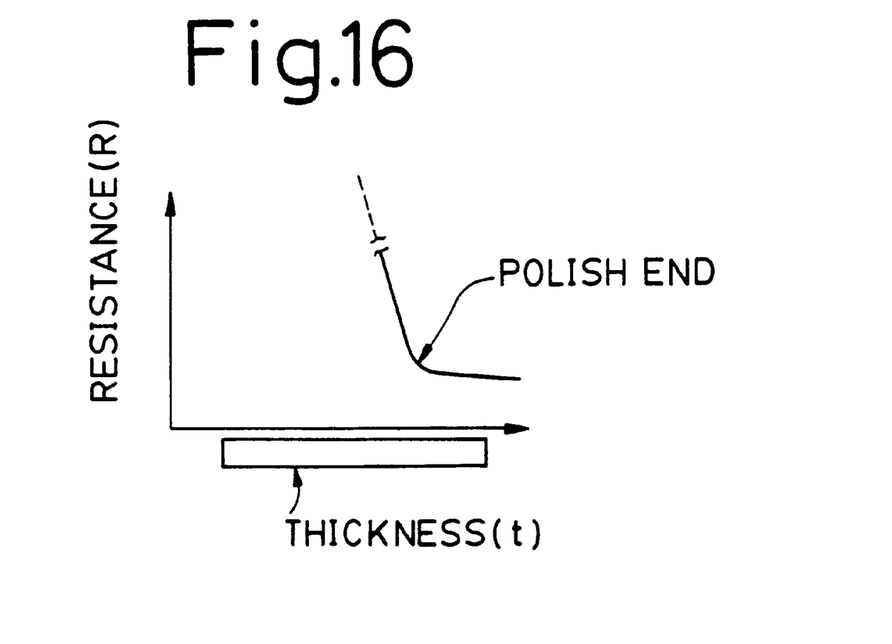
FIG. 16 is a graph illustrative of the principle of operation of the fifth embodiment.

As the polishing operation proceeds, an excessive $SiO_2$ 3 is progressively polished away and when the $Si_3N_4$ polish-stop layer 4 is exposed, the resistance between the polish head P and the $Si_3N_4$ back layer 41 of the substrate 1 drops abruptly, as shown in FIG. 16. It is, therefore, understood that if the resistance between the conductive polish end P and the $Si_3N_4$ back layer 41 is monitored while applying a constant voltage, as shown in FIG. 15, an polish end (a time point in which the polishing operation must be terminated) can be determined reliably and easily. When the polish end is detected, the $SiO_2$ on the $Si_3N_4$ polish-stop layer 41 has been removed completely.

According to the embodiment, the polish end is determined by monitoring the resistance between the substrate 1 and a contact surface between the polish head P and the substrate 1. With this detection of the polish end on the real-time base, the polishing operation can be achieved with high accuracy, and a conventional polishing process can be used without reconstruction. In this embodiment, an $Si_3N_4$ film film 41 is formed on the front and back of the substrate 1 by means of the LP-CVD, and the $SiO_2$ to be smoothed is formed by the bias ECR-CVD.

What is claimed is:

1. A method of fabricating an electronic device comprising the steps of:

preparing a silicon substrate having a surface, an etch-stop layer disposed on said surface and a polish-stop layer disposed on said etch-stop layer;

forming at least one groove in the surface of the substrate to provide a groove surface;

applying a first $SiO_2$ layer to the grooved surface employing a CVD process, said CVD process comprising an etching gas wherein the etching gas comprises a gas mixture consisting essentially of silane gas and oxidizing gas containing nitrogen;

applying a second $SiO_2$ layer to the first $SiO_2$ layer further employing the CVD process to provide a leveled surface; and providing a polishing material and mechanically applying said polishing material to the leveled surface to provide a planarized surface.

2. The method as claimed in claim 1 wherein said gas mixture comprises a ratio of $SiH_4$ to $N_2O$ comprising from about 7.5/35 sccm to about 20/35 sccm.

3. The method as claimed in claim 1 wherein the polish-stop layer comprises silicon nitride and further composes a thickness wherein the thickness comprises from about 500 angstrom to about 1000 angstrom.

4. The method as claimed in claim 1 wherein the etch-stop layer comprises $SiO_2$.

5. The method as claimed in claim 1 wherein the groove comprises an aspect ratio of at least 1.79.

6. The method as claimed in claim 1 wherein the polishing material comprises a nylon ball.

7. The method as claimed in claim 1 further comprising further providing a polishing material, mechanically applying said polishing material to the planarized surface and removing a layer of the planarized surface so that the dielectric breakdown strength of the electronic device is improved.

8. The method as claimed in claim 1 wherein said etching gas comprises a gas mixture essentially of $SiH_4$ and $N_2O$.

9. The method as claimed in claim 1 wherein said oxidizing gas is $N_2O$.

* * * * *